(12) United States Patent
Hashikura et al.

(10) Patent No.: US 7,666,006 B2
(45) Date of Patent: *Feb. 23, 2010

(54) ELECTRIC CONNECTION BOX

(75) Inventors: Manabu Hashikura, Yokkaichi (JP);
Tatsuya Sumida, Yokkaichi (JP)

(73) Assignees: Autonetwork Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/314,370

(22) Filed: Dec. 9, 2008

(65) Prior Publication Data

US 2009/0098749 A1   Apr. 16, 2009

Related U.S. Application Data

(63) Continuation of application No. 11/987,374, filed on Nov. 29, 2007, now Pat. No. 7,488,185.

(30) Foreign Application Priority Data

Dec. 5, 2006   (JP) .............................. 2006-328350

(51) Int. Cl.
*H01R 12/00* (2006.01)
(52) U.S. Cl. .................................................... 439/76.2
(58) Field of Classification Search ................ 439/76.2, 439/949, 752
See application file for complete search history.

(56) References Cited

U.S. PATENT DOCUMENTS

| | | | |
|---|---|---|---|
| 7,179,097 B2 | 2/2007 | Ishiguro et al. | |
| 7,203,070 B2 | 4/2007 | Weisz-Margulescu et al. | |
| 7,249,956 B2 | 7/2007 | Ishiguro et al. | |
| 7,488,185 B2 * | 2/2009 | Hashikura et al. .......... | 439/76.2 |

FOREIGN PATENT DOCUMENTS

| | | |
|---|---|---|
| JP | A 09-214158 | 8/1997 |
| JP | A 2000-036679 | 2/2000 |
| JP | A 2001-298290 | 10/2001 |
| JP | A 2006-019711 | 1/2006 |

OTHER PUBLICATIONS

Ishizuka, "A thermal design approach for natural air cooled electronic equipment casings", HTD, vol. 303, 1995 National Heat Transfer Conference—vol. 1, ASME 1995.

* cited by examiner

*Primary Examiner*—Phuong K Dinh
(74) *Attorney, Agent, or Firm*—Oliff & Berridge, PLC

(57) ABSTRACT

An electric connection box includes an electronic circuit board having an electronic component, and a power circuit board having a power circuit, which are disposed upright in a casing. A vertically-extending component area for mounting a heat generating component is formed on the power circuit board, so as not to face the electronic circuit board. A partition wall for separating the component area from the electronic circuit board is provided in the casing, and thereby a first air passage for allowing air to flow vertically along the component area is formed in the casing. A first inlet port connected to the first air passage is formed on the casing, and a first outlet port connected to the first air passage and positioned above the first inlet port is formed on the casing.

20 Claims, 6 Drawing Sheets

ELECTRIC CONNECTION BOX

CROSS REFERENCE TO RELATED APPLICATION

This Application is a Continuation of U.S. patent application Ser. No. 11/987,374, filed Nov. 29, 2007, which in turn is based on and incorporates herein by reference Japanese Patent Application No. 2006-328350 filed on Dec. 5, 2006.

BACKGROUND OF THE INVENTION

1. Field of the Invention

The present invention relates to an electric connection box.

2. Description of Related Art

An electric connection box shown in JP-A-H9-214158 is conventionally provided. The electric connection box is installed on a vehicle, and used for ON/OFF control of vehicle electrical components. In the electric connection box, a bus-bar board and a circuit board are vertically disposed in a casing, and arranged parallel to each other. A plurality of bus bars constituting a power circuit are arranged on the bus-bar board, while electronic components are mounted on the circuit board.

Further, relay attachment portions for connecting relays are provided on the wall of the casing. The number of relays to be connected to the electric connection box is increasing due to recent increase of electrical components to be installed on a vehicle. However, limited space for the electric connection box can be provided in the vehicle, and therefore the relays should be mounted in the electric connection box in higher density.

In view of this, there has been proposed that relays are mounted on the bus-bar board. Thereby relays can be mounted in higher density, compared to the case in which relays are attached to relay attachment portions on the casing. However, in the case that relays are mounted on the bus-bar board as described above, there arises a problem that the electronic components mounted on the circuit board may be damaged due to heat generated by the relays.

Thus, there is a need in the art for an electric connection box having an improved heat-releasing property.

SUMMARY OF THE INVENTION

An electric connection box according to the present invention includes a casing having a bottom wall, an electronic circuit board having an electronic component, and a power circuit board having a power circuit. The electronic circuit board and the power circuit board are disposed approximately perpendicular to the bottom wall in the casing.

A component area for mounting a heat generating component is formed on the power circuit board so as to extend vertically. The component area is formed outside of a portion of the power circuit board opposite to the electronic circuit board. A first air passage for allowing air to flow vertically along the component area is formed in the casing.

A first inlet port connecting to the first air passage is formed on the casing, and a first outlet port connecting to the first air passage is formed on the casing and above the first inlet port.

According to the present invention, the outside air can flow into the casing through the first inlet port, and the heat generating component disposed in the first air passage is exposed to the flowing air. Thereby the heat from the heat generating component is transferred to the air, resulting in increase in air temperature or decrease in air density inside the first air passage. The air inside the first air passage convects upward due to the chimney effect, and flows out through the first outlet port. Thereby the heat generated from the heat generating component can be effectively discharged to the outside of the casing.

Thus, the electric connection box of the present invention has an improved heat-releasing property. Negative pressure resulting from rising air in the first air passage facilitates the outside air flowing into the casing, and thereby further efficient cooling of the heat generating component can be achieved.

BRIEF DESCRIPTION OF THE DRAWINGS

Features and advantages of the present invention will become more apparent from the following detailed description made with reference to the accompanying drawings. In the drawings.

DETAILED DESCRIPTION OF THE INVENTION

The present invention will be described hereinafter with reference to embodiments and modifications.

First Embodiment

A first embodiment of the present invention will be explained with reference to FIGS. 1 through 5. An electric connection box of the present embodiment can be installed on a vehicle (not shown), and used for ON/OFF control of vehicle electronic components (not shown) such as a lamp or a power window. Specifically, the electric connection box is disposed between a battery (not shown) and the vehicle electronic components.

Figure 1:
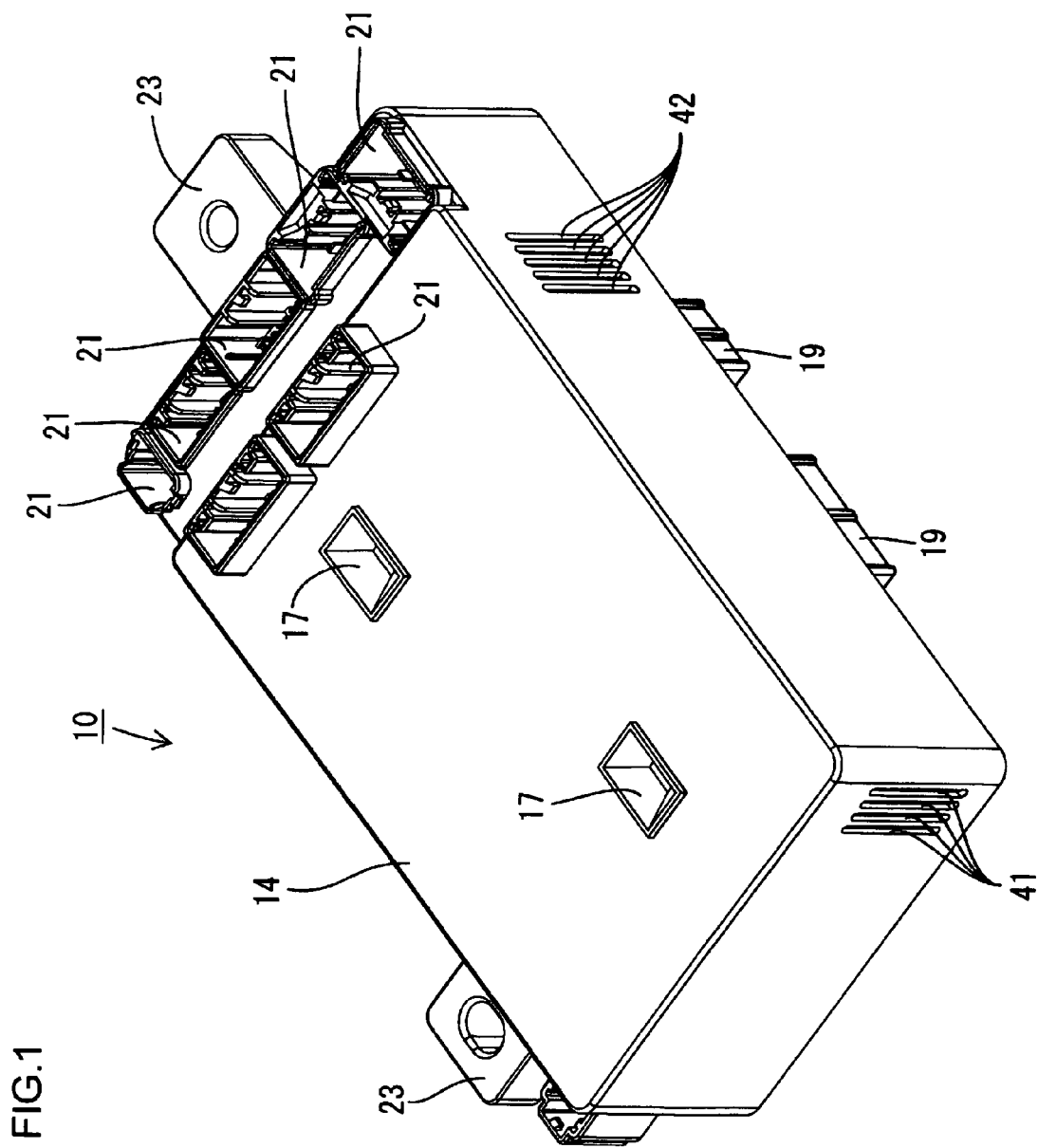
FIG. 1 is a perspective view of an electric connection box according to a first embodiment of the present invention.

Referring to FIG. 1, the electric connection box has a rectangular flat casing 10 made of synthetic resin, and is mounted with its flat surfaces upright in the passenger compartment of the vehicle. That is, the lower left side of FIG. 1 is the bottom or lower side of the electric connection box, while the upper right side of FIG. 1 is the top or upper side.

Hereinafter, the front side of FIG. 1 is referred to as the first side of the electric connection box, while the back side of FIG. 1 is referred to as the second side. Further, the lower right side of FIG. 1 is referred to as the third side of the electric connection box, while the upper left side of FIG. 1 is referred to as the fourth side. The thickness of the electric connection box or components thereof means the length in first-side to second-side direction, while the width means the length in third-side to fourth-side direction.

Figure 2:
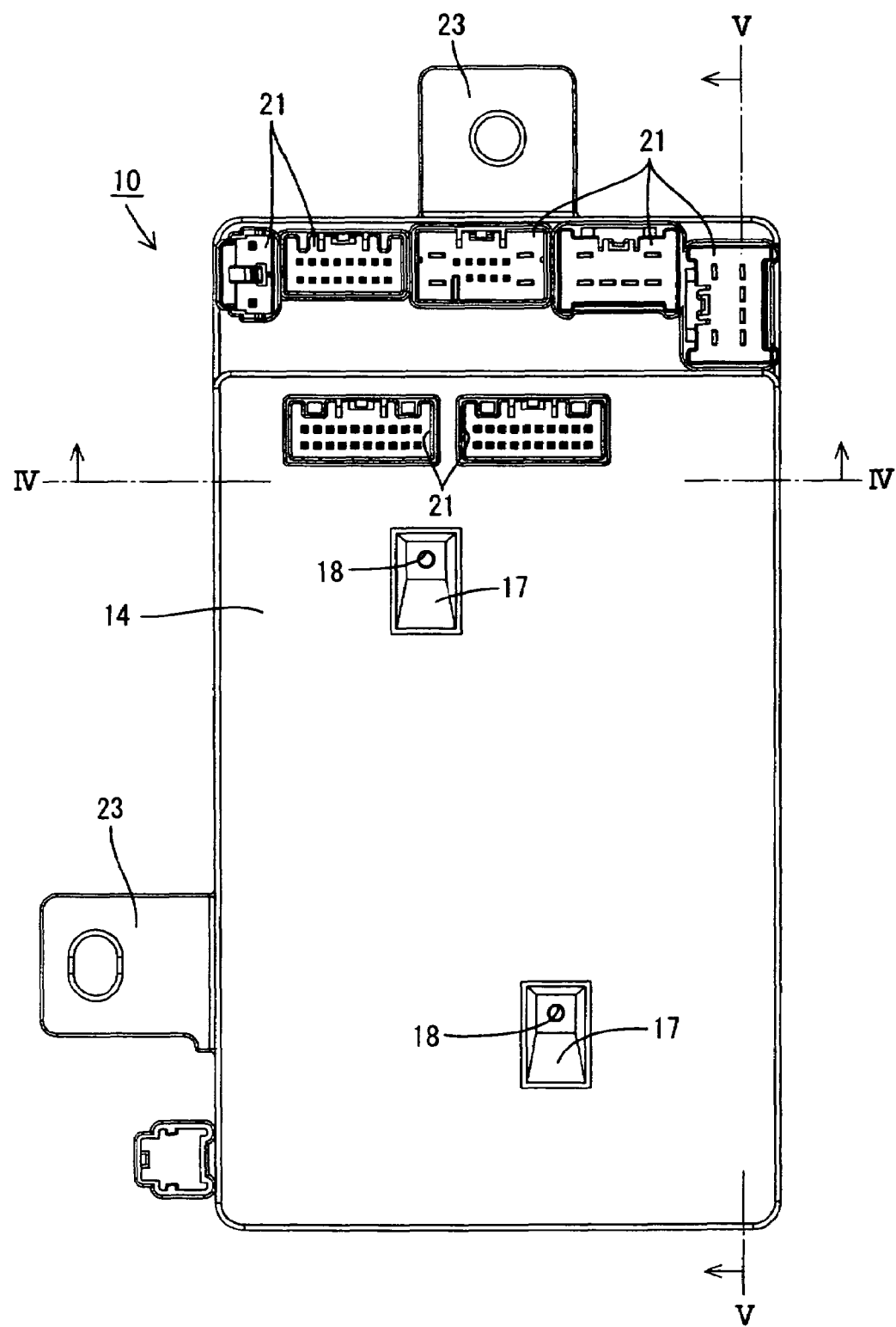
FIG. 2 is a front elevational view of the electric connection box.
Figure 3:
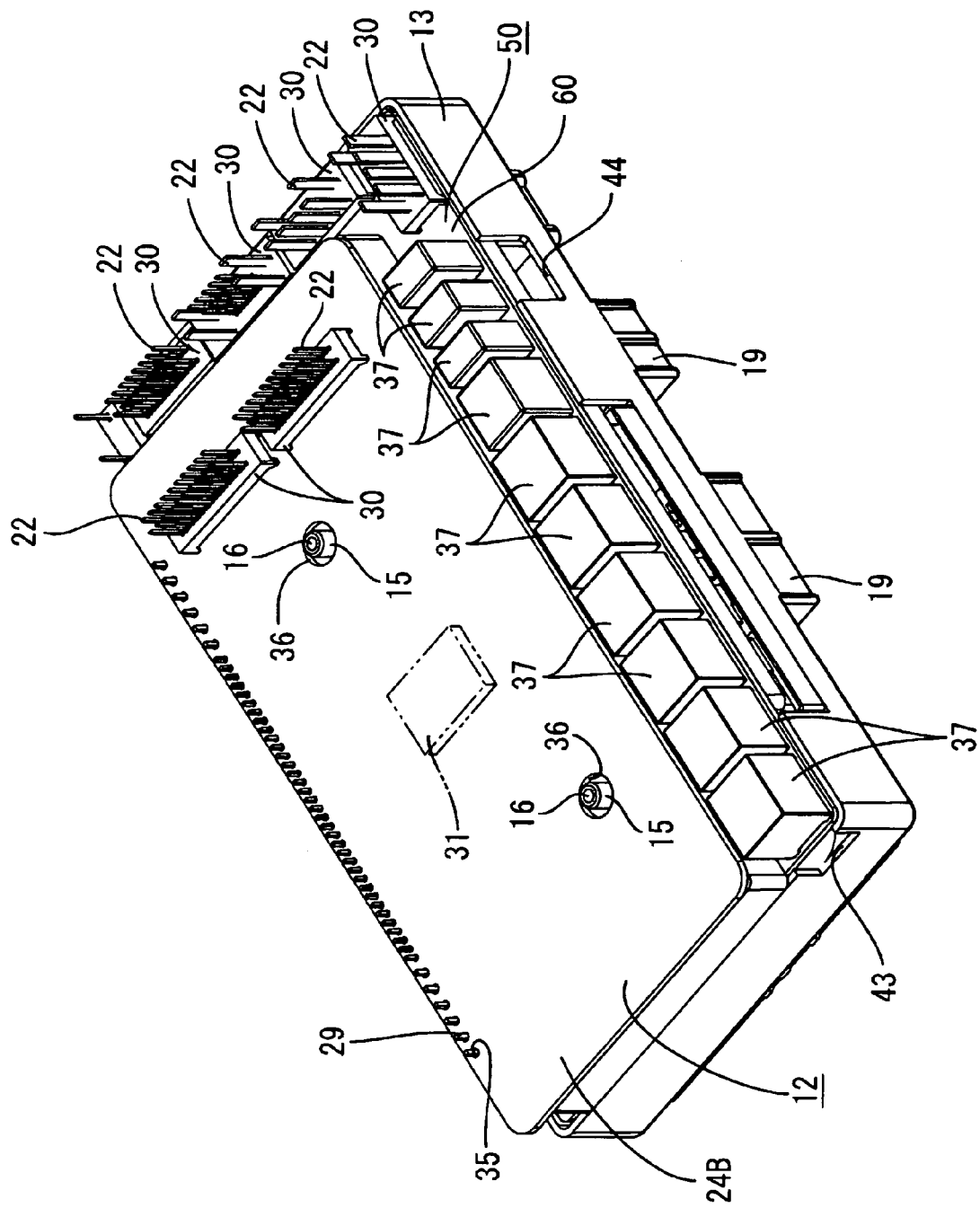
FIG. 3 is a perspective view of the electric connection box when its cover is removed.
Figure 4:
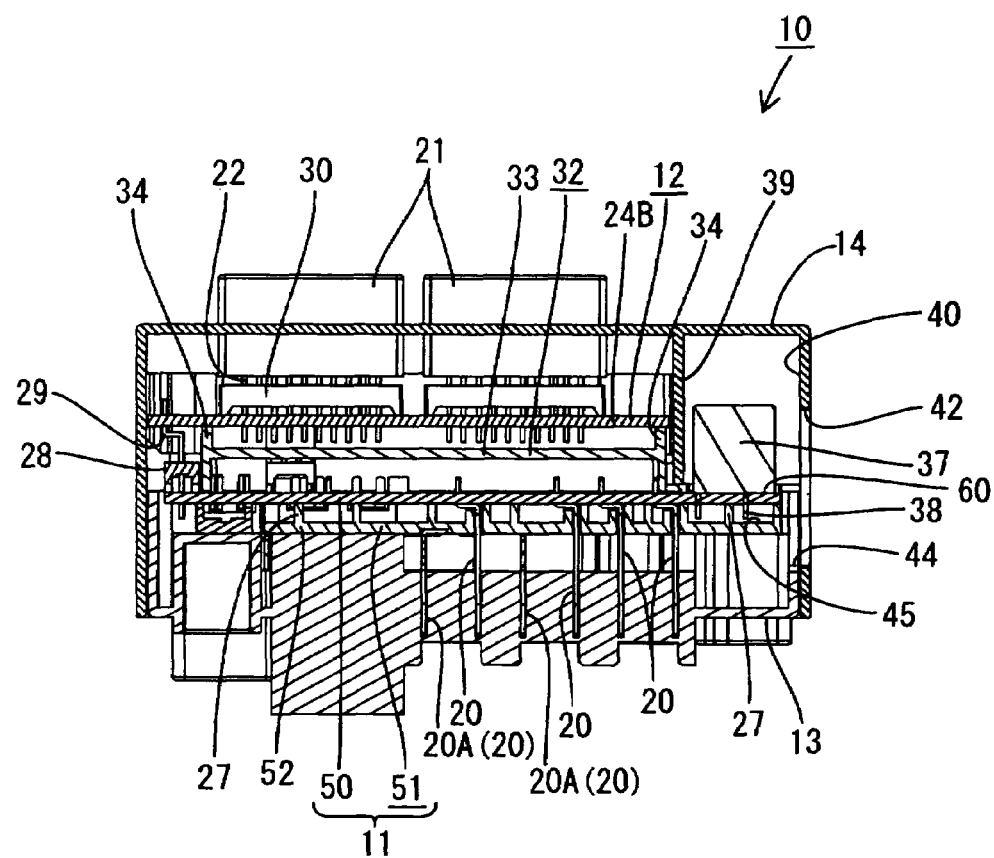
FIG. 4 is a cross sectional view of the electric connection box along the line IV-IV of FIG. 2.
Figure 5:
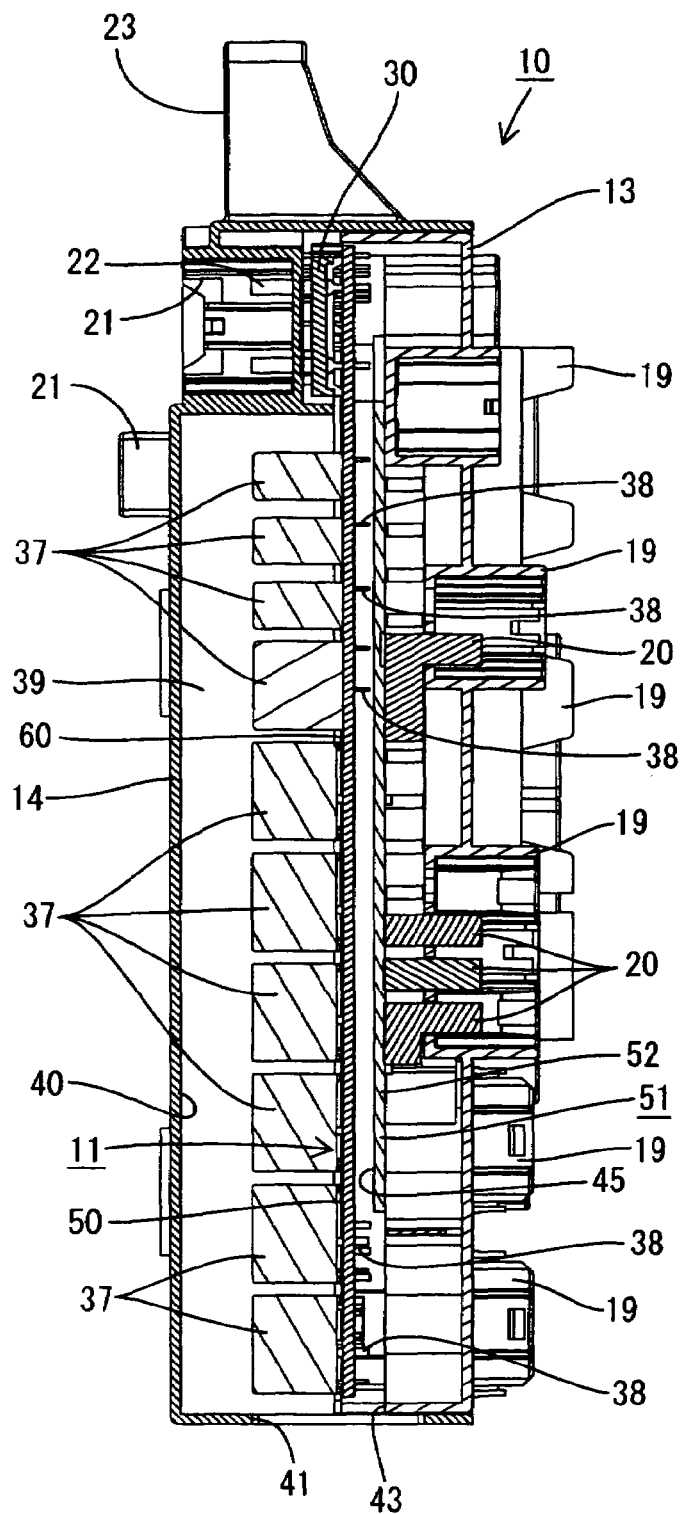
FIG. 5 is a cross sectional view of the electric connection box along the line V-V of FIG. 2.

FIG. 2 is a first-side elevational view of the electric connection box. FIG. 3 is a perspective view from the first side when a cover is removed. FIG. 4 is a horizontal sectional view along the line IV-IV of FIG. 2. FIG. 5 is a vertical sectional view along the line V-V of FIG. 2.

As shown in FIG. 4, the electric connection box includes a power circuit board 11 and an electronic circuit board 12, which are disposed upright in the casing 10. That is, the power circuit board 11 is disposed with its flat surfaces perpendicular to the bottom wall of the casing 10, and the electronic circuit board 12 is also disposed with its flat surfaces perpendicular to the bottom wall of the casing 10. Further, the power circuit board 11 and the electronic circuit board 12 are arranged parallel to each other in the present embodiment.

(Casing)

Referring to FIG. 4, the casing 10 includes a casing body 13 on its first side (i.e., the upper side of the figure), and a cover 14 on its second side (i.e., the lower side of the figure). An opening is formed on the casing body 13, and the power circuit board 11 and the electronic circuit board 12 are disposed therein. The cover 14 is provided for covering the opening of the casing body 13.

FIG. 3 shows the casing body 13 when the cover 14 is removed. Screw bosses 15 are formed on the casing body 13 so as to protrude toward the first side (i.e., the cover side), as shown in the figure. A screw hole 16 is formed in each screw boss 15.

On the other hand, as shown in FIG. 2, screw recesses 17 corresponding to the respective screw bosses 15 are formed on the cover 14. A through hole 18 for inserting a screw (not shown) is formed on the bottom of each screw recess 17.

The cover 14 is attached to the casing body 13 so as to cover the opening of the casing body 13, and screwed to the casing body 13 by engaging a screw inserted into each through hole 18 of the cover 14 with the thread of the corresponding screw hole 16 of the casing body 13. Thus the cover 14 is integrated with the casing body 13.

Referring to FIG. 3, the casing body 13 forms a shallow container-like shape. Relay attachment portions 19 for mounting relays (not shown) are formed on the second-side wall of the casing body 13. As shown in FIG. 5, the terminal portions of bus bars 20 (described below) extend into the relay attachment portions 19.

Returning to FIG. 1, the cover 14 also forms a shallow container-like shape. Mounting portions 23 for fixing the present electric connection box to the vehicle (not shown) are formed on the top wall and the lower-fourth-side wall of the cover 14, respectively. Connector hoods 21 for holding connectors of the counterparts (such as a wire harness connected to a vehicle electronic component or a battery) are formed on the first-side wall of the cover 14. The terminal portions of male tabs 22 (shown in FIG. 3 and described below) extend into the connector hoods 21 as shown in FIG. 5.

(Power Circuit Board)

The power circuit board 11 (shown in FIG. 4 or 5) substantially forms a rectangular shape, on which a power circuit is formed. The power circuit is configured to supply or distribute the power from the battery to the vehicle electronic components.

The power circuit board 11 includes a thick film substrate 50 (corresponding to a power circuit subboard of the present invention) and a bus-bar board 51 (also corresponding to a power circuit subboard of the present invention), which are arranged parallel to each other so as to keep a slight distance from each other as shown in FIG. 4 or 5.

The bus-bar board 51 includes an insulating substrate 52, on which a plurality of bus bars 20 are arranged. For example, projecting ribs (not shown) made of resin are provided on the insulating substrate 52 for fixing the bus bars 20. The bus bars 20 are pressed onto the respective ribs by thermal compression, so that the ribs are flattened. Thus, the bus bars 20 are bonded to the insulating substrate 52. Each of the bus bars 20 is formed by pressing a metal plate into a predetermined shape.

Referring to FIG. 4, ribs 27 are formed on the insulating substrate 52 so as to project toward the first side (upward in the figure). The distal ends of the ribs 27 abut on the thick film substrate 50 so that a predetermined distance is kept between the bus-bar board 51 (the insulating substrate 52) and the thick film substrate 50.

Some of the ribs 27 are offset so that a distance corresponding to the thickness of the bus bars 20 is kept between the thick film substrate 50 and the distal ends of the ribs 27. Thereby the cranked proximal end portion of the bus bar 20 adjacent to such a rib 27 is sandwiched between the second-side (lower-side in FIG. 4) surface of the thick film substrate 50 and the distal end surface of the rib 27, and penetrates the thick film substrate 50.

The penetrating proximal end of each bus bar 20 is electrically connected to a conductive path (not shown) formed on the thick film substrate 50. However, some bus bars 20A, which are provided for connecting between bus bars 20 or between a bus bar 20 and a relay (not shown), are not connected to the thick film substrate 50 as shown in FIG. 4.

Referring to FIG. 5, the distal end of each bus bar 20 penetrates the second-side (right-side in FIG. 4) wall of the casing body 13 so as to extend into the relay attachment portion 19. Thereby, each bus bar 20 can be connected to a relay (not shown).

The thick film substrate 50 has a four-layer structure, for example. As shown in FIG. 4, a junction connector 28 is disposed on the fourth-side (left-side in the figure) end portion of the thick film substrate 50.

A plurality of terminal pins 29 are mounted on the junction connector 28 so as to penetrate the thick film substrate 50. The penetrating end portion (or proximal end portion) of each terminal pin 29 is connected to the conductive path (not shown) formed on the thick film substrate 50. The other end portion (or distal end portion) of each terminal pin 29 penetrates the electronic circuit board 12 as shown in FIG. 3 or 4. Thus, the electrical connection between the thick film substrate 50 and the electronic circuit board 12 is formed.

As shown in FIG. 3 or 5, male-tab mounts 30 are provided on the top end portion of the first-side surface of the thick film substrate 50. A plurality of male tabs (male terminals) 22 are mounted on each male-tab mount 30. When the cover 14 is attached to the casing body 13 (as shown in FIG. 5), the male tabs 22 are inserted into the connector hoods 21 of the cover 14 as described above.

(Electronic Circuit Board)

In the electronic circuit board 12, referring to FIG. 3, conductive paths (not shown) are printed on an insulating substrate 24B having substantially a rectangular shape, and electronic components 31 such as a microcomputer are mounted on the conductive paths.

As shown in FIG. 4, the electronic circuit board 12 is disposed across a support member 32 from the thick film substrate 50. The support member 32 includes a base plate 33 and supporting legs 34. The supporting legs 34 project from the respective third-and-fourth-side (right-and-left-side in FIG. 4) end portions of the base plate 33 to the first and second sides (upper and lower sides in FIG. 4).

The first-side (upper-side in FIG. 4) portions of the supporting legs 34 abut on the electronic circuit board 12, while the second-side (lower-side in FIG. 4) portions of the supporting legs 34 abut on the thick film substrate 50. Thereby, the electronic circuit board 12 is held parallel to and at a distance from the thick film substrate 50.

Referring to FIG. 3, a plurality of through holes 35 are formed on the fourth-side end portion of the electronic circuit board 12, and the distal ends of the terminal pins 29 mounted on the junction connector 28 are inserted into the respective through holes 35 so as to penetrate the electronic circuit board 12 (as described above). The penetrating ends (or distal ends) of the terminal pins 29 are electrically connected to the conductive paths formed on the electronic circuit board 12.

Through holes 36 corresponding to the respective screw bosses 15 of the casing body 13 are formed on the insulating substrate 24B of the electronic circuit board 12 as shown in FIG. 3. The distal end of each screw boss 15 is inserted into the corresponding through hole 36.

Male-tab mounts 30 are provided on the upper-side (upper-right-side in FIG. 3) portion of the electronic circuit board 12, and a plurality of male tabs 22 are mounted on each male-tab mount 30. When the cover 14 is attached to the casing body 13, the male tabs 22 are inserted into the connector hoods 21 of the cover 14 as described above.

(Relay Area of Power Circuit Board)

In the present embodiment, referring to FIG. 3, the width (the upper-left-side to lower-right-side length in the figure) of the electronic circuit board 12 is shorter than that of the thick film substrate 50. Thereby, an area facing the cover 14 (i.e., an area not facing the electronic circuit board 12) is formed as a relay area 60 on the first-side (electronic circuit board 12 side) surface of the thick film substrate 50. The relay area 60 (corresponding to a component area of the present invention) extends in the vertical direction (i.e., in the upper-right-side to lower-left-side direction in FIG. 3).

A plurality of relays 37 (each corresponding to a heat generating component of the present invention) are mounted and arranged vertically on the relay area 60 of the thick film substrate 50 as shown in FIG. 3 or 5. The relay 37 having a higher heating value is disposed on the lower side of the relay area 60. For example, the relays 37 are arranged substantially in ascending order of the heating values thereof from the top of the relay area 60.

Each of the relays 37 has terminals 38 as shown in FIG. 4 or 5. The distal end of each terminal 38 penetrates the thick film substrate 50, and is electrically connected to the conductive path (not shown) formed on the thick film substrate 50.

As shown in FIG. 4 or 5, a partition wall 39 for separating the relay area 60 from the electronic circuit board 12 is formed on the cover 14. The partition wall 39 projects from the second-side (lower-side in FIG. 4) surface of the cover 14 so as to separate the relays 37 from the electronic circuit board 12. Further, the partition wall 39 extends vertically as shown in FIG. 5. Thus, a first air passage 40 for allowing air to flow vertically along the relay area 60 is formed by the partition wall 39, the cover 14 and the thick film substrate 50.

As shown in FIG. 1 or 5, a first inlet port 41 is formed through the bottom wall of the cover 14. Thereby the outside air can flow into the casing 10 from the bottom. In the present embodiment, four openings are provided as the first inlet port 41. The openings are arranged widthwise (see FIG. 1), each of which has a slit-like shape extending in the thickness direction (in the direction perpendicular to the flat surfaces of the casing 10).

Further, as shown in FIG. 1 or 4, a first outlet port 42 is formed through the upper portion of the third-side (right-side in FIG. 4) wall of the cover 14 (i.e., through a sidewall of the casing 10). Thereby the inside air can flow out of the casing 10. In the present embodiment, five lateral openings are provided as the first outlet port 42. The lateral openings are arranged vertically (see FIG. 1), each of which has a slit-like shape extending in the thickness direction (in the direction perpendicular to the flat surfaces of the casing 10).

Referring to FIG. 1, each opening of the first inlet port 41 has the same shape as that of each opening of the first outlet port 42. The first inlet port 41 and the first outlet port 42 continue to the first air passage 40, so that the outside air can flow into the first air passage 40 through the first inlet port 41 and discharged through the first outlet port 42.

As shown in FIG. 3 or 5, a lower window 43 is formed on the casing body 13 by notching the bottom wall of the casing body 13. The lower window 43 continues to the first inlet port 41 of the cover 14 (See FIG. 5), so that the outside air can flow into the second side (right side in FIG. 5) of the thick film substrate 50 through the first inlet port 41 and the lower window 43.

Further, as shown in FIG. 3 or 4, an upper window 44 is formed on the casing body 13 by notching the third-side (right-side in FIG. 4) wall of the casing body 13 (a sidewall of the casing 10). The upper window 44 continues to the first outlet port 42 of the cover 14 (See FIG. 4), so that the air from the second side (the lower side in FIG. 4) of the thick film substrate 50 can be discharged to the outside through the upper window 44 and the first outlet port 42.

As shown in FIG. 5, a second air passage 45 for allowing air to flow vertically from the lower window 43 to the upper window 44 is formed between the thick film substrate 50 and the bus-bar board 51. The terminals 38 of each relay 37, which penetrate the thick film substrate 50 as described above, are exposed to the air passing through the second air passage 45.

As shown in FIG. 5, the lower window 43 communicates between the second air passage 45 and the second-side (right-side in the figure) half of the first inlet port 41. The lower window 43 and the second-side half of the first inlet port 41 correspond to a second inlet port of the present invention, through which the outside air flows into the second air passage 45.

As shown in FIG. 4, the upper window 44 communicates between the second air passage 45 and the second-side (lower-side in the figure) half of the first outlet port 42. The upper window 44 and the second-side half of the first outlet port 42 correspond to a second outlet port of the present invention, through which the air inside the second air passage 45 flows out.

The second air passage 45 formed between the thick film substrate 50 and the bus-bar board 51 also corresponds to a third air passage of the present invention. The second inlet port (i.e., the lower window 44 and the second-side half of the first inlet port 41) also corresponds to a third inlet port of the present invention, while the second outlet port (i.e., the upper window 44 and the second-side half of the first outlet port 42) also corresponds to a third outlet port of the present invention.

(Operation and Effect of the Present Embodiment)

Next, the operation and effect of the present embodiment will be explained. When a current is applied to the vehicle electrical components through the present electric connection box, the current passes through the relays 37 on the electric connection box. Then the relays 37 generate heat, and the temperature thereof rises.

According to the present embodiment, the partition wall 39 is provided between the electronic circuit board 12 and the relays 37. Thereby, heat transfer from the relays 37 to the electronic circuit board 12 is suppressed, resulting in prevention of malfunction or the like due to the heat from the relays 37 occurring in the electronic components 31 on the electronic circuit board 12.

Further, the outside air can flow into the first air passage 40 through the first inlet port 41 of the casing 10, and the relays 37 disposed in the first air passage 40 are exposed to the flowing air. Thereby the heat from the relays 37 is transferred to the air, resulting in increase in air temperature or decrease in air density inside the first air passage 40. The air inside the first air passage 40 convects upward due to the chimney effect, and thereby the heat generated from the relays 37 is effectively discharged to the outside.

Thus, the electric connection box of the present embodiment has an improved heat-releasing property. Negative pressure resulting from rising air in the first air passage 40 facilitates the outside air flowing into the casing 10, and thereby further efficient cooling of the relays 37 can be achieved.

The relays 37 are arranged substantially in ascending order of the heating values thereof from the top of the relay area 60, so that temperature elevation of lower air is larger than that of upper air. This could result in large difference between the lower air and upper air in the first air passage 40. That is, flow of the air inside the first air passage 40 due to the chimney effect can be increased. Thereby, the heat-releasing property of the electric connection box can be further improved.

Moreover, according to the present embodiment, the first inlet port 41 of the first air passage 40 is provided on the bottom wall of the cover 41, so that the outside air having flowed into the casing 10 through the first inlet port 41 (i.e., from the bottom) passes through the first air passage 40 from bottom up. That is, the relays 37 in the first air passage 40 get the air from the bottom.

According to this construction, the flow rate or amount of the air passing by the relays 37 can be increased, compared to the case in which a first inlet port is formed on the third-side wall of the casing 10 so that the outside air having flowed into the casing 10 from the third side passes through the first air passage 40 from bottom up. That is, efficient cooling of the relays 37 can be achieved in the present embodiment.

Note that the air temperature rise due to the heat from the relays 37 could result in expansion of the air. That is, the volume of air reaching the first outlet port 42 is increased, compared to when the air has passed through the first inlet port 41. Therefore, the inside air may be prevented from smoothly flowing out through the first outlet port 42, if the total opening area of the first outlet port 42 is equal to that of the first inlet port 41.

In view of this, according to the present embodiment, five openings, each of which has the same shape as that of each opening of the first inlet port 41, are provided as the first outlet port 42 on the casing 10, in contrast with four openings as the first inlet port 41. That is, the total opening area of the first outlet port 42 is larger than that of the first inlet port 41 by an area corresponding to one opening of the first outlet port 42. Thereby the air having expanded due to the heat from the relays 37 can smoothly flow out through the first outlet port 42.

Further, according to the present embodiment, the terminals 38 of each relay 37 are exposed to the air passing through the second air passage 45. Therefore, the heat generated from the relays 37 can be also transferred to the air inside the second air passage 45 through the terminals 38. That is, the relays 37 can be also cooled by the air passing through the second air passage 45. Thus, further efficient cooling of the relays 37 can be achieved.

In the present embodiment, the first inlet port 41 (partly corresponding to the second inlet port of the present invention) is provided on the bottom wall of the casing 10, so that the outside air flowing into the second air passage 45 from the bottom can pass through the second air passage 45 from bottom up. According to this construction, the flow rate or amount of the air passing by the terminals 38 can be increased. Thereby, further efficient cooling of the relays 37 can be achieved.

As described above, the second-side half of the first inlet port 41 of the present embodiment corresponds to a second inlet port of the present invention, while the second-side half of the first outlet port 42 corresponds to a second outlet port of the present invention. Therefore, the total opening area of the second outlet port is also larger than that of the second inlet port. Thereby, the air having expanded due to the heat from the relays 37 can smoothly flow out through the second outlet port.

It is preferable to efficiently release the heat generated from the power circuit of the power circuit board 11, through which a relatively high current passes. In view of this, according to the present embodiment, the second air passage 45 (as a third air passage of the present invention) is formed between the thick film substrate 50 and the bus-bar board 51, which together constitute the power circuit board 11.

The heat generated from the power circuit can be transferred to the air passing through the second air passage 45 (corresponding to the third air passage), and thereby efficiently released. Thus, the electric connection box of the present embodiment has an improved heat-releasing property.

In the present embodiment, the plurality of relays 37 mounted on the relay area 60 of the thick film substrate 50 are arranged in a line. Thereby, high-density mounting of the relays 37 can be achieved.

In the present embodiment, the first outlet port 42 is formed on the third-side wall of the casing 10. In the case that a first outlet port is formed on the top wall of the casing 10, water fallen from above may intrude into the casing 10. In view of this, according to the present embodiment, the first outlet port 42 is formed on the sidewall of the casing 10, so that water fallen from above can be prevented from intruding into the casing 10.

In the present embodiment, the first inlet port 41 also functions as the second and third inlet ports. The first outlet port 42 also functions as the second and third outlet ports. In the case that these inlet and outlet ports are separately formed on the casing 10, the total opening area of the casing 10 should be relatively large, and thereby the strength of the casing 10 may be reduced. In view of this, according to the present embodiment, the first inlet and outlet ports 41, 42 are also provided as the second inlet and outlet ports and the third inlet and outlet ports. Thereby reduction of casing strength can be prevented.

Second Embodiment

Next, a second embodiment of the present invention will be explained with reference to FIG. 6.

In the present embodiment, an electric connection box does not include a bus-bar board 51 (or an insulating substrate 52), which is included in the first embodiment. That is, a power circuit board 11 is formed of one substrate (i.e., a thick film substrate 50) in the present embodiment. A plurality of bus bars 20 are mounted on the thick film substrate 50 so that the proximal end of each bus bar 20 penetrates the thick film substrate 50.

The other constructions are similar to the first embodiment. Therefore the similar constructions are designated by the same symbols as the first embodiment, and redundant explanations are omitted.

Figure 6:
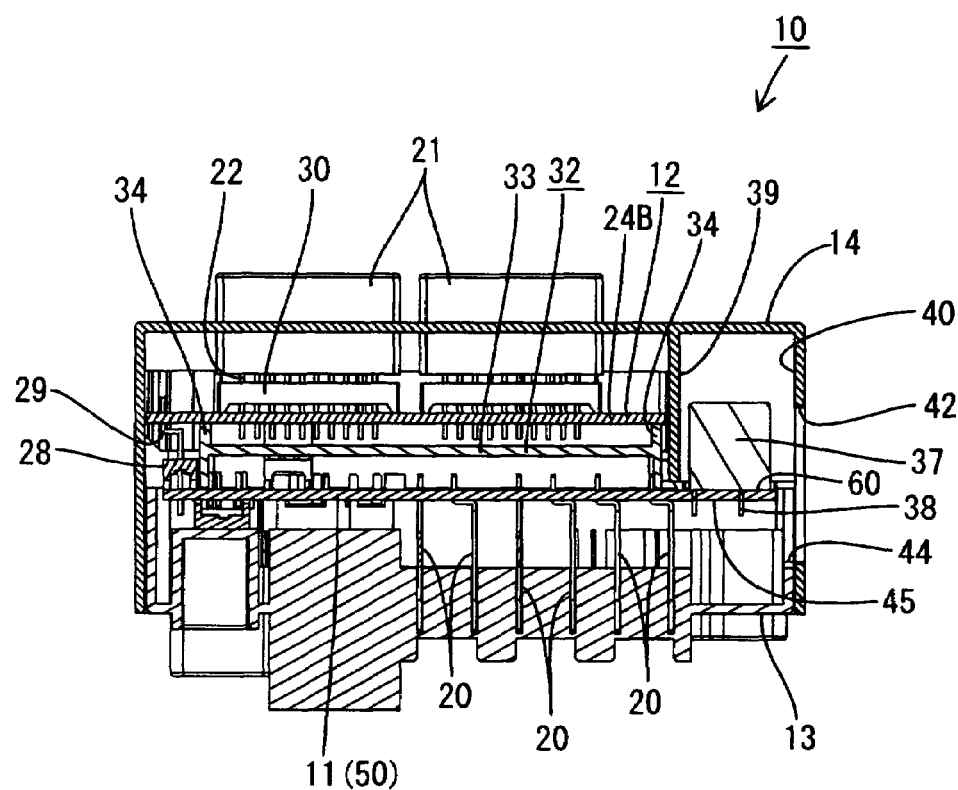
FIG. 6 is a cross sectional view of an electric connection box according to a second embodiment of the present invention.

A second air passage 45 for allowing air to flow vertically is formed along the second-side (the lower-side in FIG. 6)

surface of the power circuit board 11. Specifically, the second air passage 45 is formed between the power circuit board 11 (the thick film substrate 50) and a casing body 13.

A plurality of relays 37 are mounted on a relay area 60 formed on the first-side (upper-side in FIG. 6) surface of the thick film substrate 50, so that the terminals 38 of each relay 37 penetrate the thick film substrate 50. A first air passage 40 for allowing air to flow vertically is formed along the relay area 60, and the relays 37 are exposed to the air passing through the first air passage 40. The distal end portion of each terminal 38 is exposed to the air passing through the second air passage 45.

According to the present embodiment, the heat generated from the relays 37 is transferred to the air passing through the first air passage 40, and thereby discharged to the outside. Further, the heat generated from the relays 37 is also transferred, via the terminals 38, to the air passing through the second air passage 45, and thereby discharged to the outside. Thus, efficient cooling of the relays 37 can be achieved.

<Modifications>

The present invention is not limited to the embodiments explained in the above description made with reference to the drawings. For example, the following embodiments may be included in the technical scope of the present invention.

(1) In the above embodiments, the relay area 60 and the first air passage 40 are formed on the third-side end portion of the first-side surface of the thick film substrate 50. However, the present invention is not limited to this construction.

For example, the electronic circuit board 12 may be formed of two substrates (i.e., a third-side substrate and a fourth-side substrate), so that a gap therebetween can be formed vertically in the middle of the electronic board 12. Thereby, a relay area 60 and a first air passage 50 can be formed vertically in the middle of the first-side surface of the thick film substrate 50, so as to correspond to the gap of the electronic circuit board 12.

Alternatively, another relay area may be formed on the fourth-side end portion of the first-side surface of the thick film substrate 50 in addition to the third-side relay area 60 of the above embodiments.

(2) In the above embodiments, relays 37 as heat generating components are mounted on the relay area (component area) 60. However, the present invention is not limited to this construction. Any heat generating electronic components according to the requirements can be mounted on the component area 60 instead. For example, semiconductor switching elements can be mounted on the component area.

(3) In the above embodiments, the first inlet port 41 also functions as the second inlet port (and the third inlet port). The first outlet port 42 also functions as the second outlet port (and the third inlet port).

However, the second inlet port (and the third inlet port) may be provided separately from the first inlet port 41. This construction can be achieved by separating each opening of the first inlet port 41 (of the above embodiments) into the first-side (left-side in FIG. 5) half and the second-side (right-side in FIG. 5) half, for example. The second-side openings can be provided as the second inlet port (and the third inlet port).

Further, the second outlet port (and the third outlet port) may be provided separately from the first outlet port 42. This construction can be achieved by separating each opening of the first outlet port 42 (of the above embodiments) into the first-side (upper-side in FIG. 4) half and the second-side (lower-side in FIG. 4) half, for example. The second-side openings can be provided as the second outlet port (and the third outlet port).

(4) In the case that the heat generated from the relays 37 can be sufficiently discharged to the outside of the casing 10 through the first air passage 40, the second air passage 45 for discharging the heat from the relays 37 via the terminals 38 is not necessary. Therefore, if the heat generated from the other portions of the power circuit board 11 (i.e., the portions opposite to the electronic circuit board 12) can be also discharged sufficiently in the ordinary way or the like, the second air passage 45 (and therefore the third air passage) may be eliminated.

In this case, the first-side half of the first inlet port 41 is provided as a first inlet port, while the second-side half thereof and the lower window 43 (as a second inlet port) are eliminated. Further, the first-side half of the first outlet port 42 is provided as a first outlet port, while the second-side half thereof and the upper window 44 (as a second outlet port) are eliminated.

(5) In the above embodiments, the first outlet port 42 is formed on the third-side wall (sidewall) of the casing 10, so that water fallen from above can be prevented from intruding into the casing 10.

However, in the case that the electric connection box is installed so as not to be subject to water fallen from above, a first outlet port may be formed on the top wall of the casing 10. In this case, a first air passage should be formed so as to extend to the top of the casing 10, and therefore the connector hood 21 above the first air passage 40 of the above embodiments should be removed.

If it remains possible that water could fall from above, a canopy or the like for sheltering from water can be provided above the first inlet port formed on the top wall of the casing 10.

(6) In the above embodiments, the first inlet port 41 is formed on the bottom wall of the casing 10. However, a first inlet port may be formed on the sidewall of the casing 10 instead.

(7) In the above embodiments, the total opening area of the first outlet port 42 is larger than that of the first inlet port 41. However, the total opening area of the first outlet port 42 may be equal to or smaller than that of the first inlet port 41.

(8) The above embodiments may include a visor-like cover for preventing dust or water from intruding into the casing 10 through the first outlet port 42. For example, the visor-like cover can be provided above the first outlet port 42 so as to project from the third-side (right-side in FIG. 4) wall of the casing 10. Thereby, water fallen from above can be prevented from reaching the first outlet port 42.

(9) In the above first embodiment, the power circuit board 11 is formed of two power circuit subboards (i.e., the thick film substrate 50 and the bus-bar board 51). However, the power circuit board 11 may be formed of three or more subboards. In this case, a third air passage for discharging the heat from the power circuit board 11 can be formed between any two adjacent subboards.

Further, a circuit board as a power circuit subboard is not limited to the thick film substrate 50 or the bus-bar board 50. Any circuit board required for forming a power circuit board may be included as a power circuit subboard. For example, a circuit board including an insulating substrate and single-core wires arranged thereon may be used as a power circuit subboard.

(10) In the above second embodiment, the power circuit board 11 is formed of one circuit board, i.e., the thick film substrate 50. However, a circuit board solely constituting the power circuit board 11 is not limited to the thick film substrate 50. According to the requirement, any circuit board can be used for forming the power circuit board 11. For example, the power circuit board 11 may be formed of a bus-bar board instead of the thick film substrate 50.

(11) In the above embodiments, the power circuit board 11 and the electronic circuit board 12 are arranged parallel to each other in the rectangular flat casing 10. However, the present invention is not limited to this construction. For example, the power circuit board 11 and the electronic circuit board 12 are disposed upright in a cubic casing instead of the rectangular flat casing 10. In this case, the power circuit board 11 and the electronic circuit board 12 can be arranged perpendicular to each other, for example.

What is claimed is:

1. An electric connection box comprising:
    a casing having a bottom wall;
    an electronic circuit board being positioned approximately perpendicular to said bottom wall in said casing and having an electronic component; and
    a power circuit board being positioned approximately perpendicular to said bottom wall in said casing and having a power circuit, wherein:
    said power circuit board includes a component area for mounting a heat generating component, said component area extending vertically and being positioned outside of a portion of said power circuit board opposite to said electronic circuit board;
    a first air passage for allowing air to flow vertically along said component area is included in said casing; and
    a first inlet port connected to said first air passage is on said casing, and a first outlet port connected to said first air passage and positioned above said first inlet port is on said casing.

2. An electric connection box as in claim 1, further comprising a partition wall arranged in said casing so as to separate said component area from said electronic circuit board and so as to provide said first air passage.

3. An electric connection box as in claim 2, wherein:
    a plurality of heat generating components are mounted on said component area; and
    said plurality of heat generating components are vertically arranged, so that a heat generating component having a heating value higher than a heating-value average of said plurality of heat generating components is mounted on a lower portion of said component area.

4. An electric connection box as in claim 3, wherein said first outlet port includes a lateral opening positioned on a sidewall of said casing.

5. An electric connection box as in claim 4, wherein said first inlet port is positioned on said bottom wall of said casing.

6. An electric connection box as in claim 5, wherein an opening area of said first outlet port is larger than an opening area of said first inlet port.

7. An electric connection box as in claim 6, wherein:
    said heat generating component has a terminal;
    a second air passage for allowing air to flow vertically along said power circuit board is included so that said terminal is exposed to the air passing through said second air passage; and
    a second inlet port connected to said second air passage is on said casing, and a second outlet port connected to said second air passage and positioned above said second inlet port is on said casing.

8. An electric connection box as in claim 7, wherein said second outlet port includes a lateral opening positioned on a sidewall of said casing.

9. An electric connection box as in claim 8, wherein said second inlet port is positioned on said bottom wall of said casing.

10. An electric connection box as in claim 9, wherein an opening area of said second outlet port is larger than an opening area of said second inlet port.

11. An electric connection box as in claim 10, wherein:
    said power circuit board includes a plurality of power circuit subboards arranged parallel to each other and at a distance from each other;
    a third air passage for allowing air to flow vertically is included between two of said plurality of power circuit subboards; and
    a third inlet port connected to said third air passage is on said casing, and a third outlet port connected to said third air passage and positioned above said third inlet port is on said casing.

12. An electric connection box as in claim 10, wherein:
    said power circuit board includes a plurality of power circuit subboards arranged parallel to each other and at a distance from each other;
    a third air passage for allowing air to flow vertically is included between two of said plurality of power circuit subboards;
    a third inlet port connected to said third air passage is on said casing, and a third outlet port connected to said third air passage and positioned above said third inlet port is on said casing; and
    said third inlet port functions as said second inlet port, and said third outlet port functions as said second outlet port.

13. An electric connection box as in claim 1, wherein said first outlet port includes a lateral opening positioned on a sidewall of said casing.

14. An electric connection box as in claim 1, wherein said first inlet port is positioned on said bottom wall of said casing.

15. An electric connection box as in claim 1, wherein an opening area of said first outlet port is larger than an opening area of said first inlet port.

16. An electric connection box as in claim 1, wherein:
    said heat generating component has a terminal;
    a second air passage for allowing air to flow vertically along said power circuit board is included so that said terminal is exposed to the air passing through said second air passage; and
    a second inlet port connected to said second air passage is on said casing, and a second outlet port connected to said second air passage and positioned above said second inlet port is on said casing.

17. An electric connection box as in claim 16, wherein said second inlet port is positioned on said bottom wall of said casing.

18. An electric connection box as in claim 16, wherein an opening area of said second outlet port is larger than an opening area of said second inlet port.

19. An electric connection box as in claim 1, wherein:
    said power circuit board includes a plurality of power circuit subboards arranged parallel to each other and at a distance from each other;

a third air passage for allowing air to flow vertically is included between two of said plurality of power circuit subboards; and a third inlet port connected to said third air passage is on said casing, and a third outlet port connected to said third air passage and positioned above said third inlet port is on said casing.

20. An electric connection box as in claim 16, wherein:

said power circuit board includes a plurality of power circuit subboards arranged parallel to each other and at a distance from each other;

a third air passage for allowing air to flow vertically is included between two of said plurality of power circuit subboards;

a third inlet port connected to said third air passage is on said casing, and a third outlet port connected to said third air passage and positioned above said third inlet port is on said casing; and said third inlet port functions as said second inlet port, and said third outlet port functions as said second outlet port.

* * * * *